United States Patent [19]

Hiramatsu

[11] Patent Number: 5,406,099
[45] Date of Patent: Apr. 11, 1995

[54] HIGH ELECTRON MOBILITY TRANSISTOR

[75] Inventor: Shigeru Hiramatsu, Kanagawa, Japan

[73] Assignee: Sony Corporation, Tokyo, Japan

[21] Appl. No.: 230,871

[22] Filed: Apr. 20, 1994

Related U.S. Application Data

[63] Continuation of Ser. No. 22,083, Feb. 25, 1993, abandoned.

[30] Foreign Application Priority Data

Feb. 25, 1992 [JP] Japan .................................. 4-073167

[51] Int. Cl.⁶ ..................... H01L 29/80; H01L 29/161
[52] U.S. Cl. ..................................... 257/194; 257/201
[58] Field of Search ................. 257/194, 201, 655, 615

[56] References Cited

U.S. PATENT DOCUMENTS 4,788,156 11/1988 Stoneham et al. .................. 257/194
5,028,968 7/1991 O'Loughlin et al. ................. 357/16

FOREIGN PATENT DOCUMENTS 62-298179 12/1987 Japan ........................... H01L 29/80

OTHER PUBLICATIONS

Patent Abstracts of Japan, published Jul. 30, 1990, Hideo Toyoshima "Field Effect Transistor".
Patent Abstracts of Japan, published Jun. 7, 1988, Toshiyuki Usagawa et al, "Semiconductor Device".

Primary Examiner—Mark V. Prenty
Attorney, Agent, or Firm—Hill, Steadman & Simpson

[57] ABSTRACT

A compound semiconductor device including a substrate; a first epitaxial layer formed on the substrate, the first epitaxial layer having an impurity concentration of $1 \times 10^{15} \leq p \leq 1 \times 10^{16}$ (cm$^{-3}$); and a second epitaxial layer formed on the first epitaxial layer for allowing travel of two-dimensional electrons, the second epitaxial layer having an impurity concentration of $n \leq 1 \times 10^{14}$ (cm$^{-3}$) and $p \leq 1 \times 10^{14}$ (cm$^{-3}$). With the device disclosed, it is difficult for a short channel effect due to a reduction in gate length to occur, thereby ensuring high characteristics of the compound semiconductor device.

4 Claims, 1 Drawing Sheet

HIGH ELECTRON MOBILITY TRANSISTOR

This is a continuation of application Ser. No. 08/022,083, filed Feb. 25, 1993, and now abandoned.

BACKGROUND OF THE INVENTION

1. Field of the Invention

The present invention relates to a compound semiconductor device, and more particularly to a high electron mobility transistor (which will be hereinafter abbreviated to HEMT).

2. Description of the Prior Art

A HEMT, a kind of FET, employing a n-AlGaAs/GaAs selectively doped hetero junction has now been developed to realize a very high speed computer and a high speed signal processing system. In such a HEMT, a crystal region (e.g., undoped GaAs) for allowing travel of electrons and a crystal region (e.g., Si doped n-AlGaAs) for supplying electrons are separated from each other by a hetero junction, and scattering of electrons by donor impurities is reduced to thereby increase an electron mobility and improve a high-speed performance.

FIG. 1 schematically shows a device structure of a AlGaAs/GaAs HEMT in the prior art. An undoped GaAs layer 11 as an active layer is formed on a semi-insulating GaAs substrate 10. An i-AlGaAs layer 12 is formed on the undoped GaAs layer 11. An Si doped n-AlGaAs layer 13 as an electron supplying layer is formed on the i-AlGaAs layer 12. An Si doped n-GaAs layer 14 is formed on the n-AlGaAs layer 13. Further, a gate electrode 15, a source electrode 16 and a drain electrode 17 are formed on the n-GaAs layer 14. In FIG. 1, a hatched portion under the source electrode 16 and the drain electrode 17 is an ohmic region.

The formation of a current channel (shown by a broken line in FIG. 1) for realizing an FET operation is based on the phenomenon that the electrons supplied from the donor impurities added in the n-AlGaAs layer 13 as the electron supplying layer are moved to the undoped GaAs layer 11 as the active layer and are accumulated in a portion of the undoped GaAs layer 11 in the vicinity of a junction interface between the n-AlGaAs layer 13 and the undoped GaAs layer 11. This current channel is a so-called two-dimensional electron channel.

There is a tendency that a gate length $L_g$ has increasingly been shortened, so as to realize a high performance of the HEMT. However, the reduction in the gate length $L_g$ causes a short channel effect such that the two-dimensional electrons exude toward the substrate to reduce a mutual conductance $g_m$ and accordingly deteriorate the characteristics of the HEMT. To prevent the short channel effect, the following three techniques have conventionally been proposed;

(A) To substitute the undoped GaAs layer as the active layer by a $p^-$-GaAs layer.

(B) To make the active layer into an InGaAs strain layer channel (C) To provide an i-AlGaAs layer in the undoped GaAs layer as the active layer and form a hetero junction.

In technique (A), the electrons in the active layer are scattered by the impurities existing in the active layer to reduce the electron mobility. Further, the number of two-dimensional electron carriers is also reduced.

In technique (B), a lattice constant of the InGaAs layer is different from that of the n-GaAs layer, and a strain of the InGaAs layer increases with an increase in thickness of the InGaAs layer. As a result, lattice defects in the InGaAs layer increase to reduce the electron mobility. Accordingly, the thickness of the InGaAs layer is limited to a critical thickness of 15 to 20 nm, and the InGaAs layer cannot be thickened. However, in the InGaAs layer having such a critical thickness, the number of two-dimensional electron carriers is reduced.

In technique (C), the two-dimensional electron gas is scattered in the vicinity of the hetero junction interface between the undoped GaAs layer and the i-AlGaAs layer to reduce the electron mobility, causing the generation of noise.

SUMMARY OF THE INVENTION

It is an object of the present invention to provide a compound semiconductor device having high characteristics which can suppress a short channel effect due to a reduction in gate length $L_g$.

According to the present invention, to attain the above object, there is provided a compound semiconductor device comprising a substrate; a first epitaxial layer formed on said substrate, said first epitaxial layer having an impurity concentration of $1 \times 10^{15} \leq p \leq 1 \times 10^{16}$ (cm$^{-3}$); and a second epitaxial layer formed on said first epitaxial layer for allowing travel of two-dimensional electrons, said second epitaxial layer having an impurity concentration of $n \leq 1 \times 10^{14}$ (cm$^{-3}$) and $p \leq 1 \times 10^{14}$ (cm$^{-3}$).

The first epitaxial layer has a thickness of preferably 500 to 1000 nm, and the second epitaxial layer has a thickness of preferably 20 to 100 nm.

In the compound semiconductor of the present invention, the two-dimensional electrons traveling in the second epitaxial layer are only susceptible to a small extent to scattering by the impurities. Accordingly, a high electron mobility can be attained. Furthermore, since the first epitaxial layer is provided, the two-dimensional electrons can be effectively confined in the hetero junction interface between the first epitaxial layer and the second epitaxial layer. Therefore, it is difficult for a short channel effect to occur. Moreover, since the two-dimensional electrons travel in a portion of the second epitaxial layer remote from the first epitaxial layer, a reduction in number of carriers by acceptors existing in the first epitaxial layer does not occur. Accordingly, a high sheet carrier concentration can be obtained.

Other objects and features of the invention will be more fully understood from the following detailed description and appended claims when taken with the accompanying drawings.

DETAILED DESCRIPTION OF THE PREFERRED EMBODIMENTS

A preferred embodiment of the compound semiconductor device according to the present invention will now be described with reference to the drawings.

Figure 1:
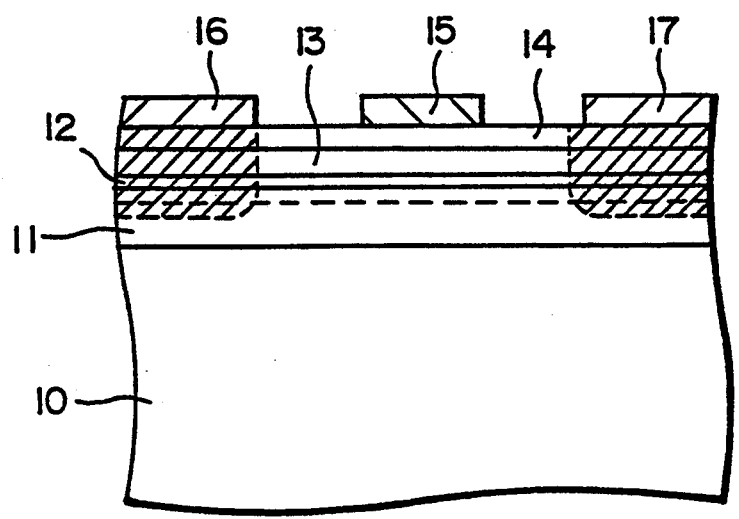
FIG. 1 is a schematic sectional view of a HEMT in the prior art.
Figure 2:
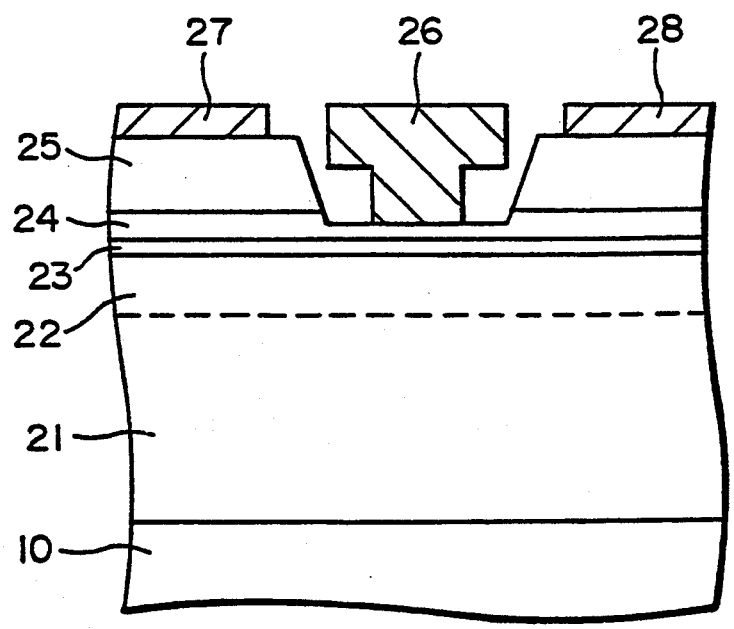
FIG. 2 is a schematic sectional view of a compound semiconductor device according to the present invention.

FIG. 2 shows a schematic sectional view of a HEMT as a compound semiconductor device as manufactured by MOCVD in the following manner. First, a first epitaxial layer 21 is formed on a semi-insulating GaAs substrate 10. The first epitaxial layer 21 is a p$^-$-GaAs layer having a thickness of 500 nm. An impurity concentration in the first epitaxial layer 21 is p=5×10$^{15}$ (cm$^{-3}$). The impurity concentration in the first epitaxial layer 21 may be fixed or sloped.

Then, a second epitaxial layer 22 is formed on the first epitaxial layer 21. The second epitaxial layer 22 is an i-GaAs layer having a thickness of 50 nm. An impurity concentration in the second epitaxial layer 22 is n=1×10$^{14}$ (cm$^{-3}$) and p=1×10$^{14}$ (cm$^{-3}$). An impurity concentration in the second epitaxial layer 22 is n=1×10$^{14}$ (cm$^{-3}$) and p=1×10$^{14}$ (cm$^{-3}$).

The first epitaxial layer 21 and the second epitaxial layer 22 may be formed by controlling a ratio of AsH$_3$ and Ga(CH$_3$)$_3$ in MOCVD, for example.

Then, an i-Al$_{0.3}$Ga$_{0.7}$As layer 23 is formed on the second epitaxial layer 22. Then, an n-Al$_{0.3}$Ga$_{0.7}$As layer 24 is formed on the i-Al$_{0.3}$Ga$_{0.7}$As layer 23. Then, an n-GaAs layer 25 is formed on the n-Al$_{0.3}$Ga$_{0.7}$As layer 24. Then, on the basis of a conventional HEMT manufacturing process, element separation is carried out, and source and drain electrode metal (Au.Ge/Ni) is deposited under vacuum on the n-GaAs layer 25 to carry out alloying for obtaining ohmic contact with the second epitaxial layer 22. Then, photoresist is coated on the whole surface of the metal layer, and a T-shaped gate electrode pattern is then formed through the photoresist. Then, the n-GaAs layer 25 and the n-Al$_{0.3}$Ga$_{0.7}$As layer 24 are etched to form a recess as shown in FIG. 2. Then, gate electrode metal (Ti-Pt-Au or Al) is deposited under vacuum on the n-Al$_{0.3}$Ga$_{0.7}$As layer 24 in the recess. Thus, a T-shaped gate electrode 26 having a gate length L$_g$ of 0.15 μm, a source electrode 27 and a drain electrode 28 are formed. The previously discussed two-dimensional electron channel results in the second epitaxial layer 22 at a position remote by about 10 nm from the interface between the second epitaxial layer 22 and the i-Al$_{0.3}$Ga$_{0.7}$As layer 23.

Although each layer is formed by MOCVD in the above preferred embodiment, it may be formed by MBE rather than MOCVD. Further, a buffer layer may be formed between the semi-insulating substrate and the first epitaxial layer. Further, although the compound semiconductor device of the present invention has been embodied as a HEMT forming the GaAs/AlGaAs hetero junction, the compound semiconductor device of the present invention may be applied to a HEMT forming an InGaAs/InAlAs hetero junction, wherein the InGaAs layer comprises the first and second epitaxial layers.

In the compound semiconductor device of the present invention, a short channel effect due to a reduction in gate length can be suppressed and C$_{gs}$ can be reduced, so that a high mutual conductance g$_m$ can be obtained to ensure a superior low-noise characteristic. Furthermore, since the compound semiconductor device has no critical thickness as in the InGaAs strain layer channel mentioned previously, the two epitaxial layers can be optimally set. Further, there is no generation of noise due to the hetero junction interface as in the traditional case where the i-AlGaAs layer is provided in the undoped GaAs layer as the active layer.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A HEMT compound semiconductor device, comprising:
   a substrate;
   a first epitaxial layer formed on said substrate, said first epitaxial layer having a p-type impurity concentration of 1×10$^{15}$ (cm$^{-3}$);
   a second epitaxial layer formed on said first epitaxial layer for allowing travel of two-dimensional electrons in an electron channel located near an upper edge of said second epitaxial layer, said second epitaxial layer having an impurity concentration of n≦1×10$^{14}$ (cm$^{-3}$) and p≦1×10$^{14}$ (cm$^{-3}$);
   an intrinsic layer on the second epitaxial layer;
   an n-type electron supplying layer on the intrinsic layer;
   a gate electrode on the n-type electron supplying layer; and
   a source electrode connecting to the n-type electron supplying layer on one side of the gate electrode and a drain electrode connecting to the n-type electron supplying layer on the other side of the gate electrode.

2. The semiconductor device according to claim 1 wherein the second epitaxial layer is formed of GaAs.

3. The semiconductor device according to claim 1 wherein the second epitaxial layer is formed of InGaAs.

4. The semiconductor device according to claim 1 wherein another n-type layer is provided on the n-type electron supplying layer between the source electrode and electron supplying layer and the drain electrode and the electron supplying layer.

* * * * *